United States Patent [19]

Slemmer

[11] Patent Number: 5,465,233
[45] Date of Patent: Nov. 7, 1995

[54] STRUCTURE FOR DESELECTING BROKEN SELECT LINES IN MEMORY ARRAYS

[75] Inventor: William C. Slemmer, Dallas, Tex.

[73] Assignee: SGS-Thomson Microelectronics, Inc., Carrollton, Tex.

[21] Appl. No.: 69,025

[22] Filed: May 28, 1993

[51] Int. Cl.$^6$ ................................................. G11C 7/00
[52] U.S. Cl. .............................. 365/200; 365/63; 365/72
[58] Field of Search .................... 365/230.01, 189.06, 365/200, 63, 72, 230.06, 189.11, 149

[56] References Cited

U.S. PATENT DOCUMENTS

| | | | |
|---|---|---|---|
| 4,587,638 | 5/1986 | Isobe et al. | 365/230.01 X |
| 4,760,559 | 7/1988 | Hidaka et al. | 365/189.11 |
| 4,905,194 | 2/1990 | Ohtsuka et al. | 365/230.06 |
| 5,111,435 | 5/1992 | Miayamoto | 365/230.06 |
| 5,161,121 | 11/1992 | Cho | 365/189.06 |

Primary Examiner—David C. Nelms
Assistant Examiner—Son Dinh
Attorney, Agent, or Firm—Renee M. Larson; Lisa K. Jorgenson; Richard K. Robinson

[57] ABSTRACT

According to the present invention, a structure for holding broken select lines in a memory array deselected addresses the prior art problems associated with floating broken select lines, such as standby current and disruption of attached memory cells. The structure is a high impedance device which is placed on the end of select lines so that if a select line is broken during fabrication, the high impedance device will hold the broken end of the select line to the desired deselect voltage. Select lines which have a driver at one end only and are broken during fabrication, but have the high impedance device on the other end, are not allowed to float. The high impedance device is also suitable for select lines which are not broken and previously were anchored at just one end. Suitable high impedance devices include a reverse biased diode, a weak transistor, a poly R memory cell load device, and an ON or OFF TFT memory cell load device.

9 Claims, 2 Drawing Sheets

STRUCTURE FOR DESELECTING BROKEN SELECT LINES IN MEMORY ARRAYS

BACKGROUND OF THE INVENTION

1. Field of the Invention

The present invention relates generally to integrated circuit memory devices, and more specifically to a structure for deselecting broken select lines in memory arrays.

2. Description of the Prior Art

Many memory devices with a redundancy scheme have broken select lines in the memory array. Memory devices that commonly employ broken select lines include static random access memories (SRAMs), erasable programmable read only memories (EPROMs), electrically erasable read only memories (EEPROMs), Flash EEPROMs, and other specialty memory devices such as tag RAMs and Zeropower® devices. A recent trend in the memory device field is to use more redundancy as the density of such devices increases. As the density of memory devices having broken select lines increases, problems associated with these broken select lines increase as well.

In SRAM technology, the select lines for a memory array are connected to a large number of memory cells, or local row decoders, in the array. Typical select lines may include a row line, a master row line, a word line, or an X-Line. These lines select, in a parallel fashion, the memory cells or local row decoders necessary to access a particular portion of the memory array. When that portion of the memory array is not to be selected, the select lines are held in a deselect state to disable all connected cells or local row decoders.

In the DRAM prior art, word select lines perform the same function as outlined above. Word lines are held at a low logic level at both ends by devices, often called holding devices, which are capable of maintaining this low logic level on unselected word lines in the presence of strong capacitive coupling from a selected word line and from bit lines—half or more of which have positive-going transitions during the cycle. DRAM row lines are high impedance such that a holding transistor placed on one end of the row line is not sufficient to hold the entire length of the row line in a deselected state. A quite word flip-flop or other deselect scheme is often used to provide clamping means which prevent bouncing of word lines or row lines. Later improvements in the development of DRAMs provided precharge, such as $V_{cc}/2$, that balances this coupling for selection, separation and equilibration of bit lines to the word lines, thus making holding devices less important.

In contrast, traditionally the number of SRAM bit lines driven during any given cycle is small, so that problems are not encountered with coupling of these bit lines to the word lines in the memory array. Thus, select lines have been held deselected at one end only, and holding devices have not been needed on both ends of a SRAM select line. However, there can be a problem with sections of broken select lines in the memory array. When the array is repaired by substituting spare or redundant elements for broken select lines, the end of each of these broken select lines near the driver is held deselected, but the far end of a broken select line may not be held deselected and may float. Floating broken select lines may drift in a positive direction, causing high standby current, and, in extreme cases, may produce enough bit line current from connected cells to disrupt the operation of some of the connected bit lines. Unlike the DRAM, however, there is no strong coupling which drives these lines positive.

Therefore, it would be desirable in the art to prevent the charging of floating select lines in memory arrays with little or no adverse effect on the speed or selection of select lines. Prevention of high standby current or bitline current is especially desirable as memory devices become more dense and use more redundancy.

SUMMARY OF THE INVENTION

Therefore, according to the present invention, a structure for holding broken select lines in a memory array deselected addresses the prior art problems associated with floating broken select lines, such as standby current and disruption of attached memory cells. The structure is a high impedance device which is placed on the end of select lines so that if a select line is broken during fabrication, the high impedance device will hold the broken end of the select line to the desired deselect voltage. Select lines which have a driver at one end only and are broken during fabrication, but have the high impedance device on the other end, are not allowed to float. The high impedance device is also suitable for select lines which are not broken and previously were anchored at just one end. Suitable high impedance devices include a reverse biased diode, a weak transistor, a poly R memory cell load device, and an ON or OFF TFT memory cell load device.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

In SRAM technology, select lines in a memory array are connected to a large number of memory cells, or local row decoders, in the array. Typical select lines may be a row line, a master row line, a word line, or an X-Line. These lines select, in a parallel fashion, the memory cells or local row decoders necessary to access a particular portion of the memory array. When that portion of the memory array is not to be selected, the select lines are held in a deselect state to disable all connected cells or local row decoders.

Figure 1:
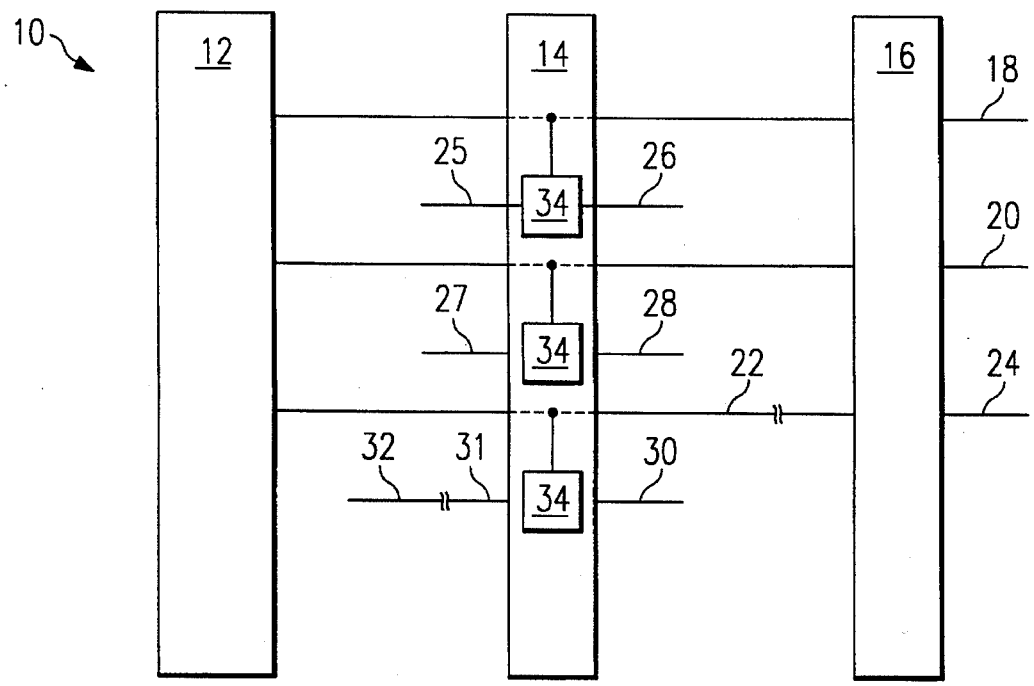
FIG. 1 is a schematic diagram of select lines in a portion of a memory array according to the prior art.

Referring to FIG. 1, a schematic diagram of select lines in a portion of a memory array 10 according to the prior art is shown. Master row decode logic block 12 is connected to local row decode logic blocks 14 and 16 through master row select lines 18, 20, and 22, which are in turn connected to one or more local row decode logic and driver circuitry 34 inside local row decode logic blocks 14 and 16 as shown. Master row select lines 18, 20, and 22 are held deselected at the end connected to the master row decode logic block 12 by a driver inside master row decode logic 12. However, broken master row select line 24, which was intended to be deselected by deselecting master row select line 22 and substituting a spare or redundant element, is left floating. A floating select line, such as broken master row select line 24, is undesirable, because it may float to the selected state causing high standby current. In extreme cases, a floating broken select line may produce enough bit line current to disrupt operation of the memory array.

Also shown in FIG. 1 are word select lines 25, 26, 27, 28, 30, 31, and 32. Word lines 25, 26, 27, 28, 30 and 31 are each held deselected at one end by local word line decoder logic and driver circuitry 34 in a manner similar to how master row select lines 18, 20, 22 are held deselected. Floating broken word select line 32 is analogous to floating broken master row select line 24. It too may have been deselected and replaced by a spare or redundant element to repair the memory array. Like broken master row select line 24, broken word select line 32 may cause standby current problems or interfere with the operation of the memory array.

In the DRAM prior art, word select lines are held at a low logic level at both ends by devices, often called holding devices, which are capable of maintaining this low logic level on unselected word lines in the presence of strong capacitive coupling from a selected word line and from bit lines—half or more of which have positive-going transitions during the cycle. DRAM row lines have high impedance such that a holding transistor placed on one end of the row line is not sufficient to hold the entire length of the row line in a deselected state. A quite word flip-flop or other deselect scheme is often used to provide clamping means which prevent bouncing of word lines or row lines.

Figure 2:
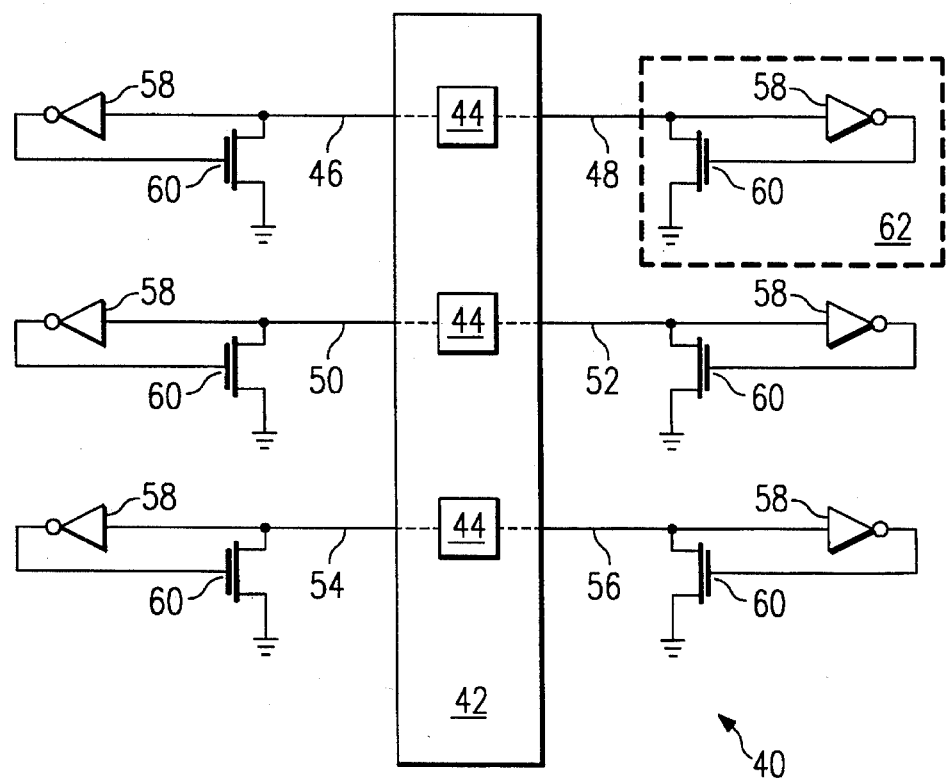
FIG. 2 is a schematic diagram of a quite word flip flop in a portion of a dynamic random access memory (DRAM) array according to the prior art.

Referring to FIG. 2, a schematic diagram 40 of a quite word flip flop in a portion of a DRAM array according to the prior art is shown. Row decode logic block 42 contains row decode logic and driver circuitry 44 which functions to hold deselected one end of word lines 46, 48, 50, 52, 54, and 56. Quite word flip-flop circuitry 62 is comprised of inverter 58 and transistor 60, and provides clamping means which prevent the bouncing of word lines to which they are attached. When row decode logic and driver circuitry 44 drives low, quite word flip-flop circuitry 62 ensures that the end of the word line opposite row decode logic and driver circuitry 44 is also held low. When row decode logic and driver circuitry 44 drives high, the trip point of inverter 58 is passed. The output signal of inverter 58 is connected back to the gate of transistor 60, causing transistor 60 to turn off. As is well known in the art, the inverter function provided by inverter 58 could also be provided by two transistors properly connected.

While the quite word flip-flop 62 of FIG. 2 is an effective solution to bouncing word lines in DRAMs, broken select lines in SRAMs beg a different approach. To prevent the charging of floating select lines, a high impedance device can be placed at the floating end of the select lines. A variety of devices, including a weak transistor, a poly R memory cell load device, an ON or OFF thin film technology (TFT) memory cell load device, and a reverse biased diode, may be sufficient to hold the floating end of a broken select line deselected. A reverse biased diode may be used because the charging currents in an SRAM memory array are very small. The choice of either an ON or OFF TFT memory cell load device depends on the parasitic coupling present; an ON TFT memory cell load device may be more attractive when more parasitic coupling is present and an OFF TFT memory cell load device may be more attractive when there is less parasitic coupling. In each case, the high impedance device should leak charge, pulling the floating line toward the deselect voltage, but have enough impedance to have little or no effect on the speed or level of selection on normal select lines.

This high impedance device may also be suitable on normal select lines where the voltage level of the select line is boosted and subjected to discharge, without the need to use the quite word flip-flop deselect clamping scheme employed in DRAMs.

Figure 3:
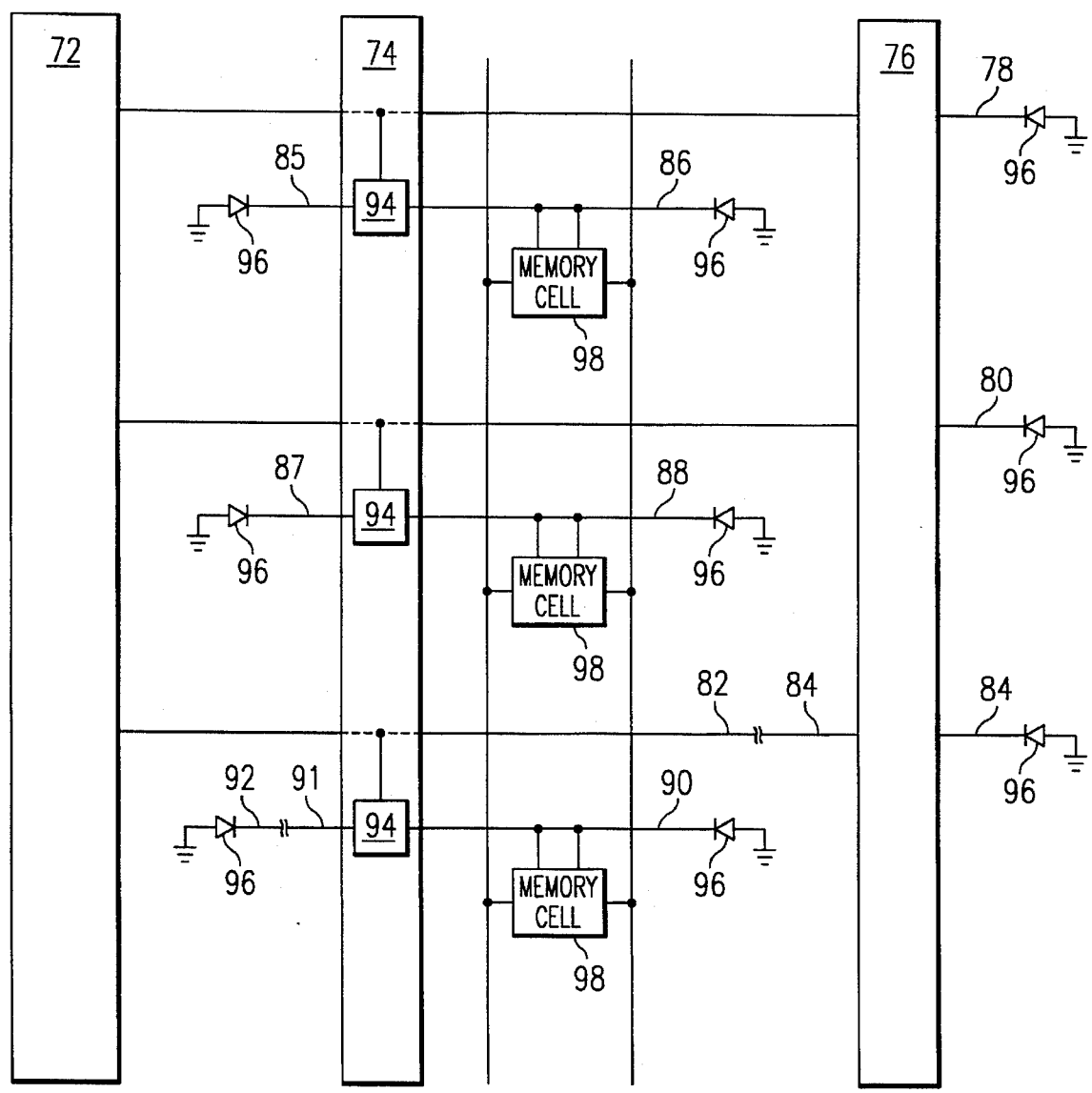
FIG. 3 is a schematic of select lines in a portion of a memory array according to a preferred embodiment of the present invention.

Referring to FIG. 3, a schematic diagram of select lines in a portion of a memory array 70 according to the present invention is shown. Memory cells 98 are connected to select lines 86, 88, and 90 as shown. In order to prevent the ends of master row select lines 78, 80, 84 and word select lines 85, 86, 87, 88, 90, and 92 from floating, high impedance reverse biased diodes 96 are placed at the ends of these select lines. The high impedance reverse biased diodes 96 present on broken master row select line 84 and broken word select line 92 ensure that these broken select lines can be held deselected and will not randomly float. Additionally, high impedance reverse biased diodes 96 help to hold both ends of master row select lines 78, 80 and word select lines 85, 86, 87, 88, and 90 to the desired deselect voltage.

Reverse biased diodes 96 are used because the currents required for charging up the select lines is very small. The impedance of reverse biased diodes 96 is carefully chosen to ensure the presence of leakage charge, which pulls the floating select lines toward the proper deselect voltage level, but with a high enough impedance value so as to have little or no effect on the speed or level of selection on normal select lines.

Many memory devices employ broken select lines in their memory arrays, including SRAMs, EPROMs, EEPROMs, and Flash EEPROMS. A structure for holding broken select lines in a memory array deselected has been shown. The use of such a structure addresses the prior art problems associated with floating broken select lines, such as standby current and disruption of the memory array. The structure is a high impedance device which is placed on select lines at the end of the select lines opposite the driver. Should a select line be broken and separated from the driver, the high impedance device holds the end opposite the driver to the desired deselect voltage. The high impedance device is also suitable for select lines which are not broken and previously were anchored at just one end. Suitable high impedance devices include a reverse biased diode, a weak transistor, a poly R memory cell load device, and an ON or OFF TFT memory cell load device.

While the invention has been particularly shown and described with reference to a preferred embodiment, it will be understood by those skilled in the art that various changes in form and detail may be made therein without departing from the spirit and scope of the invention.

What is claimed is:

1. Memory array circuitry for selecting a portion of a memory array, comprising:

a plurality of memory cells;

a plurality of select lines which select a portion of the memory cells in the memory array when set to a select voltage level and which deselect a portion of the memory array when set to a deselect voltage level, each select line having a first end and a second end, with the first end of a select line connected to a driver; and a plurality of high impedance reverse biased diodes, with a reverse biased diode connected to the second end of the select line which holds the select line to the deselect voltage level if the select line is broken.

2. The circuitry of claim 1, wherein the select line is a master row line.

3. The circuitry of claim 1, wherein the select line is a word line.

4. The circuitry of claim 1, wherein the high impedance reverse biased diode leaks charge, thereby pulling the select line, to which it is connected, to the deselect voltage level.

5. Memory array circuitry for selecting a portion of a memory array, comprising:

a plurality of local row decoders connected to a plurality of memory cells;

a plurality of select lines, both master row lines and word lines, connected to the local row decoders which select a portion of the memory array when set to a select voltage level and which deselect a portion of the memory array when set to a deselect voltage level, each select line having a first end and a second end, with the first end of a select line connected to a driver; and a plurality of high impedance reverse biased diodes, with a reverse biased diode connected to the second end of the select line which holds the select line to the deselect voltage level if the select line is broken.
with a reverse biased diode connected to the second end of the select line which holds the select line to the deselect voltage level if the select line is broken.

6. The circuitry of claim 5, wherein the word lines are connected to the master row lines through at least one of a row decode logic and driver circuitry.

7. The circuitry of claim 6, wherein the master row lines are connected to at least one of a master row decode logic block which provides the driver on the first end of each of the master row lines.

8. The circuitry of claim 6, wherein the driver on the first end of each of the word lines is provided by the row decode logic and driver circuitry to which it is connected.

9. The circuitry of claim 5, wherein the high impedance reverse biased diode leaks charge, thereby pulling the select line, to which it is connected, to the deselect voltage level.

* * * * *